(12) United States Patent
Jeong

(10) Patent No.: US 7,884,637 B2
(45) Date of Patent: Feb. 8, 2011

(54) CALIBRATION CIRCUIT AND SEMICONDUCTOR MEMORY DEVICE WITH THE SAME

(75) Inventor: Chun-Seok Jeong, Ichon-shi (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 408 days.

(21) Appl. No.: 11/967,720

(22) Filed: Dec. 31, 2007

(65) Prior Publication Data
US 2009/0059704 A1 Mar. 5, 2009

(30) Foreign Application Priority Data
Aug. 29, 2007 (KR) ...................... 10-2007-0087070

(51) Int. Cl.
*H03K 17/16* (2006.01)
(52) U.S. Cl. .............................. 326/30; 326/26; 326/86; 326/83; 327/108; 327/109
(58) Field of Classification Search .................. 326/26, 326/30, 81–83, 86–87; 327/108–109
See application file for complete search history.

(56) References Cited

U.S. PATENT DOCUMENTS

| 5,606,275 | A  | * | 2/1997 | Farhang et al. ............... 327/108 |
| 6,466,487 | B1 | * | 10/2002 | Otsuka .................. 365/189.05 |
| 6,794,909 | B1 | * | 9/2004 | Urakami et al. ............. 327/112 |
| 6,958,613 | B2 |   | 10/2005 | Braun et al. |
| 6,980,020 | B2 |   | 12/2005 | Best et al. |
| 7,151,390 | B2 |   | 12/2006 | Nguyen et al. |
| 7,170,313 | B2 |   | 1/2007 | Shin |
| 7,176,711 | B2 |   | 2/2007 | Park et al. |
| 7,268,712 | B1 | * | 9/2007 | Sheen ........................ 341/120 |
| 7,514,954 | B2 | * | 4/2009 | Kim et al. ..................... 326/30 |
| 2003/0218477 | A1 | * | 11/2003 | Jang et al. ..................... 326/30 |

FOREIGN PATENT DOCUMENTS

| JP | 2005-285125   | 10/2005 |
| JP | 2006-129423   | 5/2006 |
| KR | 1020050104236 A | 11/2005 |
| KR | 1020070008245 A | 1/2007 |

OTHER PUBLICATIONS

Notice of Allowance issued from Korean Intellectual Property Office on Feb. 19, 2009 with an English Translation.

* cited by examiner

*Primary Examiner*—James H. Cho
*Assistant Examiner*—Christopher Lo
(74) *Attorney, Agent, or Firm*—IP & T Group LLP

(57) ABSTRACT

A calibration circuit is capable of correcting an error of a calibration operation by adjusting a calibration code generated thereby. The calibration circuit of a semiconductor memory device includes a code generator, a calibration resistor unit, and a variable resistor unit. The code generator is configured to generate a calibration code for determining a termination resistance in response to a voltage of a first node and a reference voltage. The calibration resistor unit, which has internal resistors turned on/off in response to the calibration code, is connected to the first node. The variable resistor unit is connected in parallel with the calibration resistor unit and has a resistance that varies with a setting value.

16 Claims, 5 Drawing Sheets

CALIBRATION CIRCUIT AND SEMICONDUCTOR MEMORY DEVICE WITH THE SAME

CROSS-REFERENCE TO RELATED APPLICATIONS

The present invention claims priority to Korean patent application number 10-2007-0087070, filed on Aug. 29, 2007, which is incorporated by reference in its entirety.

BACKGROUND OF THE INVENTION

The present invention relates to an impedance matching circuit used in various semiconductor integrated circuits such as a semiconductor memory device, and more particularly to a calibration circuit configured to more easily correct an error occurring in the impedance matching circuit.

Semiconductor devices implemented by integrated circuit (IC) chips such as central processing units (CPUs), memories, and gate arrays are incorporated into a variety of electrical products such as personal computers, servers and workstations. Most of semiconductor devices include an input circuit configured to receive signals from the outside via input pads and an output circuit configured to provide internal signals to the outside via output pads.

As the operating speed of electrical products is increasing, a swing width of a signal exchanged between semiconductor devices is being gradually reduced for minimizing a delay time taken for signal transmission. However, as the swing width of the signal is being reduced, an external noise has a greater influence on the signal transmission and signal reflection becomes more critical at an interface terminal due to impedance mismatch. Such impedance mismatch is generally caused by an external noise, a variation of a power supply voltage, a change in an operating temperature, a change in a manufacturing process, etc. The impedance mismatch may lead to a difficulty in high-speed transmission of data and distortion in output data. Therefore, if semiconductor devices receive the distorted output data through an input terminal, it frequently gives rise to problems such as a setup/hold failure and an error in decision of an input level.

In particular, in order to resolve the above problems, a memory device requiring high-speed performance employs an impedance matching circuit near around a pad inside an IC chip. In order to match the impedance between devices, typically source termination is performed at a transmitting end by an output circuit, and parallel termination is performed at a receiving end by a termination circuit connected in parallel to an input circuit.

ZQ calibration refers to a procedure of generating pull-up and pull-down codes which are varied with PVT (process, voltage and temperature) conditions. The resistance of the input and output circuits, e.g., a termination resistance at a DQ pad in a semiconductor memory device, is calibrated using the codes resulting from the ZQ calibration. Here, the term of ZQ calibration is attributed to the fact that the calibration is performed using a ZQ node.

Hereinafter, how the ZQ calibration is performed in a calibration circuit will be described.

FIG. 1 is a block diagram of a conventional calibration circuit for performing ZQ calibration.

Referring to FIG. 1, the conventional calibration circuit configured to perform ZQ calibration includes a first calibration resistor unit 110, a dummy calibration resistor unit 120, and a second calibration resistor unit 130, a reference voltage generator 102, comparators 102 and 103, and counters 105 and 106. The first calibration resistor unit 110 is provided with a plurality of pull-up resistors that are turned on/off in response to a pull-up calibration code PCODE<0:N>. The dummy calibration resistor unit 120 has the same construction as the first calibration resistor unit 110. The pull-down calibration resistor unit 130 is provided with a plurality of pull-down resistors that are turned on/off in response to a pull-down calibration code NCODE<0:N>.

The first calibration resistor unit 110 is calibrated to an external resistor 101 connected to a ZQ node to generate the calibration code PCODE<0:N>. The second calibration resistor unit 130 is calibrated to a dummy calibration resistor unit 120 to generates the calibration code NCODE<0:N>, wherein the dummy calibration resistor unit 120 has the same resistance as the first calibration resistor unit 110 using the calibration code PCODE<0:N>.

As for the operation, the comparator 103 compares a ZQ node voltage with a reference voltage VREF (generally, set to VDDQ/2) generated from a reference voltage generator 102, thereby generating up/down signals. Herein, the ZQ node voltage is generated by coupling the first calibration resistor unit 110 to an external resistor 101 (generally, 240Ω) connected to a ZQ pin that is coupled to the ZQ node.

The pull-up counter 105 receives the up/down signals to generate the pull-up calibration code PCODE<0:N> as a binary code, which turns on/off the resistors connected in parallel in the first calibration resistor unit 110, thereby calibrating total resistance of the first calibration resistor unit 110. The calibrated resistance of the first calibration resistor unit 110 affects the ZQ node voltage again, and the above-described calibration procedure is then repeated. That is, the first calibration resistor unit 110 is calibrated such that the total resistance of the first calibration resistor unit 110 is equal to the resistance of the external resistor 101, which is called a pull-up calibration.

The binary code, i.e., the pull-up calibration code PCODE<0:N>, generated during the pull-up calibration is inputted into the dummy calibration resistor unit 120 to determine total resistance of the dummy calibration resistor unit 120 which is equal to resistances of the first calibration resistor unit 110 and the external resistor 101. Thereafter, a pull-down calibration starts to be performed in a similar manner to the pull-up calibration. Specifically, the pull-down calibration is performed such that a voltage of a node A is equal to the reference voltage VREF using the comparator 104 and the pull-down counter 106, that is, the total resistance of the second calibration resistor unit 130 is equal to the total resistance of the dummy calibration resistor unit 120.

The binary codes PCODE<0:N> and NCODE<0:N> resulting from the ZQ calibration, i.e., pull-up and pull-down calibrations, are inputted to pull-up and pull-down resistors (termination resistors) at input/output pads, which are identically configured to the pull-up and pull-down calibration resistor units in the calibration circuit of FIG. 1, thus determining termination resistance. In a semiconductor memory device, resistances of pull-up and pull-down resistors at a DQ pad are determined.

For reference, although both pull-up and pull-down calibration operations are performed to generate pull-up calibration codes PCODE<0:N> and pull-down calibration codes NCODE<0:N> for determining resistances of the pull-up and pull-down resistors at input/output pads, both of the pull-up and pull-down resistors are not always provided at the input/output pads. For example, in a semiconductor memory device, both the pull-up and pull-down resistors are used at an output driver but only the pull-up resistor is used at an input buffer.

Therefore, if only the pull-up resistor is provided at input/output pads, the calibration circuit of FIG. 1 only includes the pull-up calibration resistor unit 110, the counter 105 and the comparator 103, which are configured to generate the pull-up calibration codes PCODE<0:N>. An operation of this case is the same as the above-described pull-up calibration.

FIG. 2 is a block diagram illustrating the case where the calibration circuit is applied to a semiconductor memory device. Specifically, FIG. 2 illustrates how termination resistance of an output driver of the semiconductor memory device is determined using the calibration codes PCODE<0:N> and NCODE<0:N> generated from the calibration circuit of FIG. 1.

The output driver configured to output data in the semiconductor memory device includes pre-drivers 210 and 220, and pull-up and pull-down termination resistor units 230 and 240 for outputting data.

The pre-drivers 210 and 220 control the pull-up termination resistor unit 230 and the pull-down termination resistor unit 240, respectively. When outputting high-level data, the pull-up termination resistor unit 230 is turned on so that a data pin DQ goes to 'HIGH' state. On the contrary, when outputting low-level data, the pull-down termination resistor unit 240 is turned on so that the data pin DQ goes to 'LOW' state. That is, the data pin DQ is pull-up or pull-down terminated to thereby output data of logic high or low level.

At this time, number of resistors in the pull-up and pull-down termination resistors 230 and 240 to be turned on is determined by the pull-up and pull-down calibration codes PCODE<0:N> and NCODE<0:N>. Specifically, which resistor unit is turned on between the pull-up and pull-down termination resistor units 230 and 240 is mainly determined depending on logic level of output data, but which resistor is turned on among the resistors provided in one of the termination resistor units 230 and 240 that has been selected to be turned on is determined by the pull-up calibration code PCODE<0:N> or pull-down calibration code NCODE<0:N>.

For reference, target resistances of the pull-up and pull-down termination resistor units 230 and 240 are not necessarily equal to resistances (240Ω) of the calibration resistor units (see 110, 120 and 130 of FIG. 1) but may be a resistance of one-half (120Ω) or one-quarter (60Ω) of 240Ω, etc. In FIG. 2, reference symbols DQP_CTRL and DQN_CTRL inputted to the pre-drivers 210 and 220 denote various control signals exemplarily.

The ZQ calibration operation of the conventional calibration circuit is based on the assumption that there is no mismatch between the resistors of the calibration resistor units (110, 120 and 130 of FIG. 1) and those of the termination resistor units 230 and 240 and the resistance can be increased or decreased at a predetermined ratio.

However, mismatch exists between the resistors due to process variation or the like. Hence, the termination resistor units may not have a target resistance due to a variety of factors such as offset of a comparator in the calibration circuit, a noise in power supply voltage, a line loading, pad resistance and package resistance. If the termination resistor unit does not have a target resistance, there may occur distortion in input/output data. Accordingly, it is necessary to develop a calibration circuit capable of correcting an error.

SUMMARY OF THE INVENTION

Embodiments of the present invention are directed to providing a calibration circuit that can correct an error of a calibration operation by adjusting a calibration code generated thereby.

In one embodiment, a calibration circuit of a semiconductor memory device includes a code generator configured to generate a calibration code for determining a termination resistance in response to a voltage of a first node and a reference voltage, a calibration resistor unit connected to the first node, including internal resistors turned on/off in response to the calibration code, and a variable resistor unit, connected in parallel with the calibration resistor unit, configured to vary a resistance with a setting value.

In another embodiment, a calibration circuit includes a code generator configured to generate a first calibration code in response to a voltage of a first node and a reference voltage and generate a second calibration code in response to a voltage of a second node and the reference voltage, a first calibration resistor unit connected to the first node and having a resistance that varies with the first calibration code, a first variable resistor unit connected in parallel with the first calibration resistor unit and having a resistance that varies with a first setting value, a second calibration resistor unit connected to the second node and having a resistance that varies with the second calibration code, and a second variable resistor unit connected in parallel with the second calibration resistor unit and having a resistance that varies with a second setting value.

DESCRIPTION OF SPECIFIC EMBODIMENTS

Hereinafter, preferred embodiments of the present invention will be described in detail with reference to the accompanying drawings. The present invention is not limited to the embodiments disclosed below, but may be implemented in various forms. The embodiments set forth below are provided only for complete disclosure of the invention and so that those skilled in the art can fully know the scope of the invention.

Figure 1:
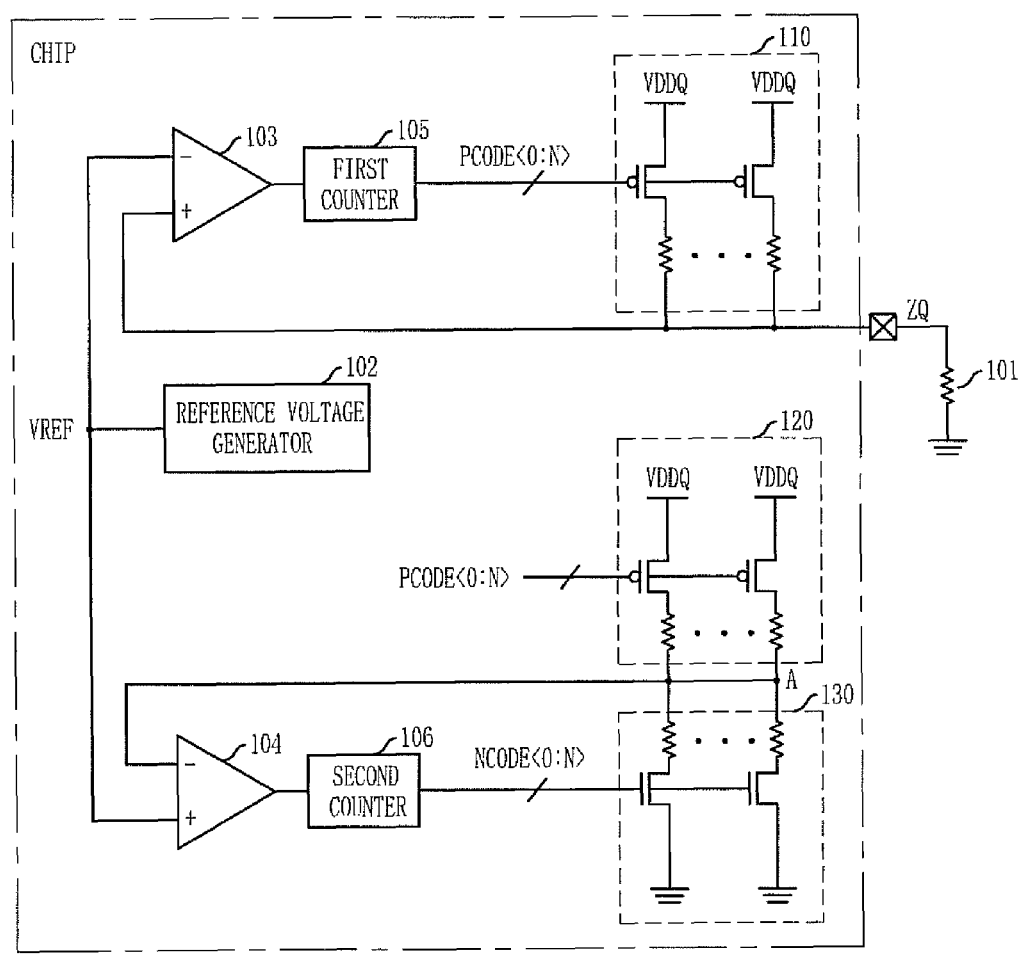
FIG. 1 is a block diagram of a conventional calibration circuit for performing ZQ calibration.
Figure 2:
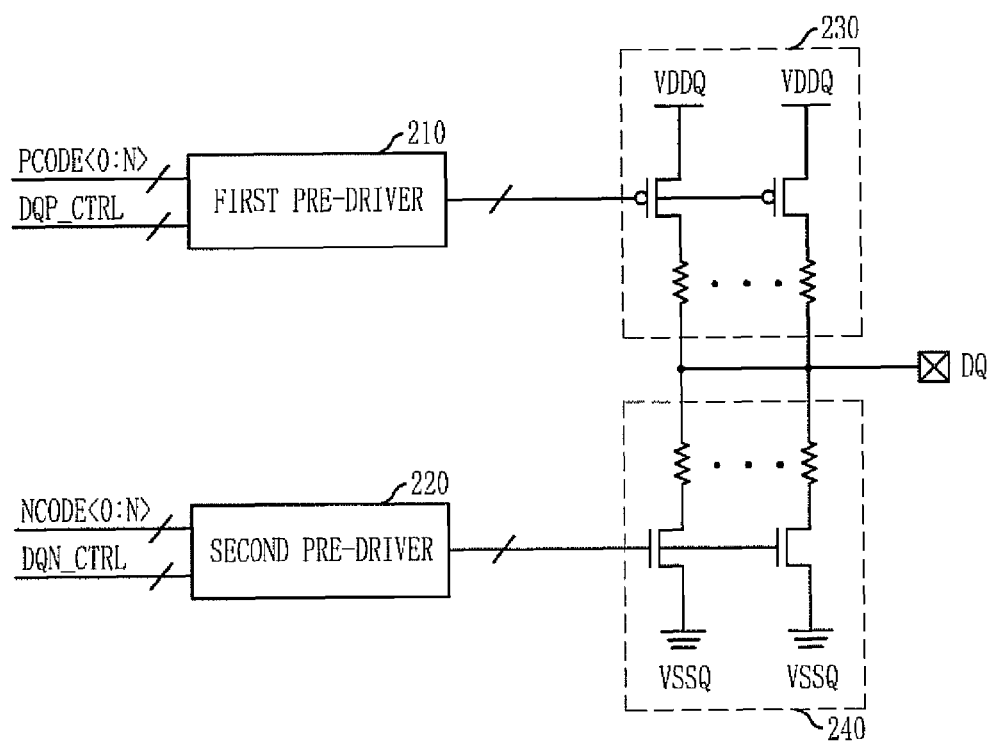
FIG. 2 is a block diagram illustrating the case where the calibration circuit is applied to a semiconductor memory device.
Figure 3:
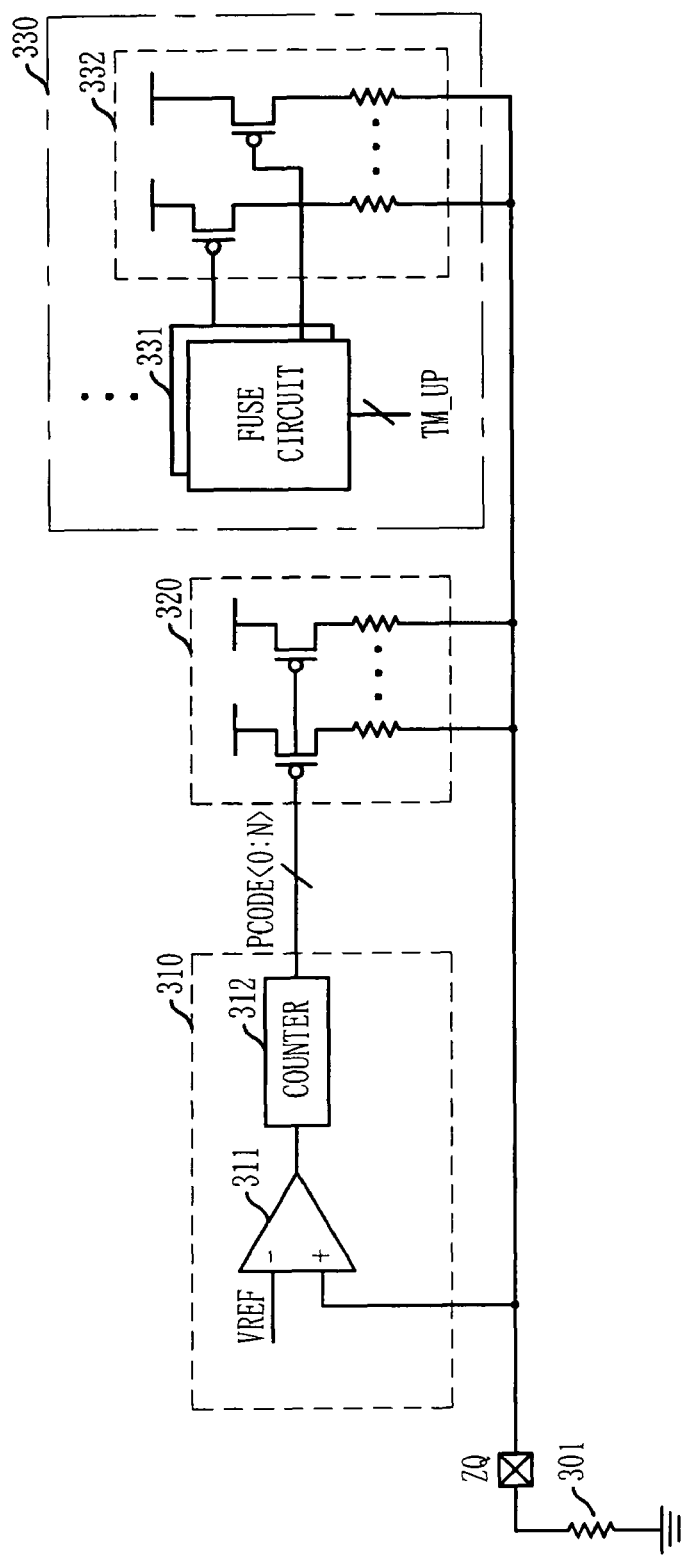
FIG. 3 is a block diagram illustrating a calibration circuit of a semiconductor memory device in accordance with an embodiment of the present invention.

FIG. 3 is a block diagram illustrating a calibration circuit of a semiconductor memory device in accordance with an embodiment of the present invention.

In FIG. 3, it is illustrated that the calibration circuit generates one calibration code. The calibration circuit of FIG. 3 includes a code generator 310 configured to generate a calibration code PCODE<0:N> for determining termination resistance in response to a voltage of a first node ZQ and a reference voltage VREF (generally, ½ VDDQ); a calibration resistor unit 320 of which internal resistors are turned on/off in response to the calibration code PCODE<0:N>, the calibration resistor unit 320 being connected to the first node ZQ; and a variable resistor unit 330 connected to the calibration resistor unit 320 in parallel and having a resistance varied with a setting value.

The code generator 310 may include a comparator 311 configured to compare the voltage of the first node ZQ with the reference voltage VREF and a counter 312 configured to count the calibration code PCODE<0:N> in response to a comparison result of the comparator 311. The calibration resistor unit 320 changes the voltage of the first node ZQ in response to the calibration code PCODE<0:N>.

The variable resistor unit 330 is newly employed in the calibration circuit of the present invention, and connected to the calibration resistor unit 320 in parallel. The resistance of the variable resistor unit 330 is determined according to a setting value. A calibration operation is an operation of generating the calibration code PCODE<0:N> such that the voltage of the first node ZQ is equalized to the reference voltage VREF. In the conventional calibration circuit, the resistance of the calibration resistor unit 320 is equal to that of the external resistor 301 when the calibration operation is completed.

However, since the variable resistor unit 330 is newly added in the present invention, a total resistance of the calibration resistor unit 320 and the variable resistor unit 330 is equal to the resistance of the external resistor 301 when the calibration operation is completed. Therefore, the calibration code PCODE<0:N> is generated differently from the conventional calibration circuit where the variable resistor unit 330 is not present. This means that the calibration code PCODE<0:N> can be changed by varying the resistance of the variable resistor unit 330. Hence, it is possible to correct an error of the calibration operation.

The variable resistor unit 330 may include at least one fuse circuit 331 configured to output a signal in response to whether a fuse is cut or not, and at least one resistor unit 332 configured to be turned on/off in response to the output signal of the fuse circuit 331. Basically, the setting value of the variable resistor unit 330 is determined by whether the fuse is cut or not. Alternatively, the setting value of the variable resistor unit 330 may be determined in response to a test mode signal TM_UP. Once the fuse has been cut out, it is impossible to restore the original state of the fuse. Therefore, it is preferable that a setting value is applied first as a trial through the application of the test mode signal TM_UP to thereby determine a suitable setting value and thereafter the fuse is cut out. Number of each of the fuse circuit 331 and the resistor unit 332 may be changed according to circuit design. The error of the calibration operation can be corrected only if each of the fuse circuit 331 and the resistor unit 332 is provided singularly. However, it is possible to minutely adjust the resistance of the variable resistor unit 330 if the number of each of the fuse circuit 331 and the resistor unit 332 increases. Detailed description for the fuse circuit 331 will be set forth later.

FIG. 3 exemplarily illustrates that the calibration circuit generates the pull-up calibration code PCODE<0:N> as the calibration code. In the case where the calibration circuit generates one calibration code as shown in FIG. 3, the generated calibration code is not always the pull-up calibration code PCODE<0:N> but may be a pull-down calibration code NCODE<0:N>. In the case of generating the pull-down calibration code NCODE<0:N>, the external resistor 301 will be connected as a pull-up resistor, and the calibration resistor unit 320 and the variable resistor unit 330 will be configured with pull-down resistors, which will slightly differ from the calibration circuit of FIG. 3.

Figure 4:
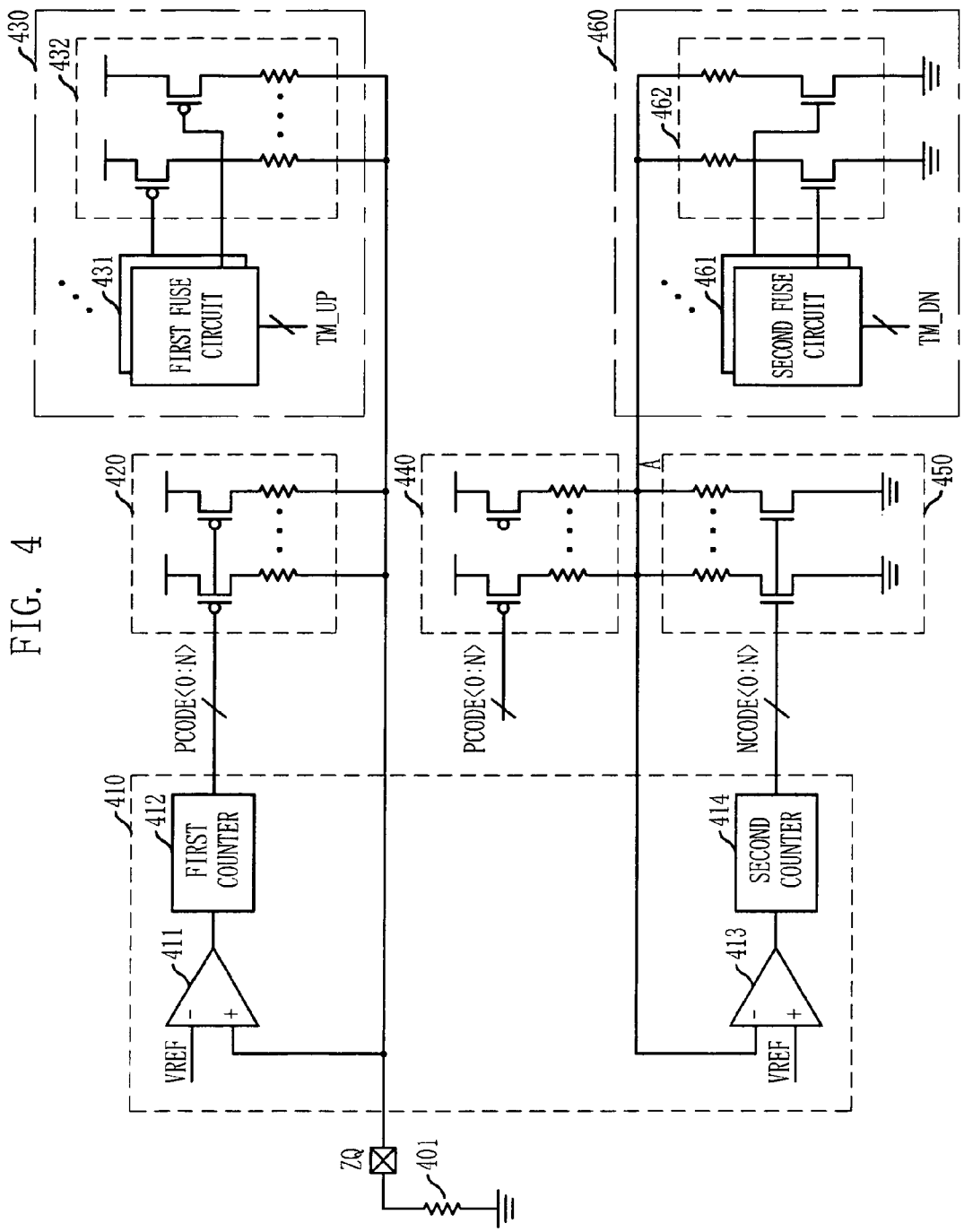
FIG. 4 is a block diagram illustrating a calibration circuit of a semiconductor memory device in accordance with another embodiment of the present invention.

FIG. 4 is a block diagram illustrating a calibration circuit of a semiconductor memory device in accordance with another embodiment of the present invention.

In FIG. 4, it is illustrated that the calibration circuit generates two calibration codes PCODE<0:N> and NCODE<0:N>. The calibration circuit of FIG. 4 includes a code generator 410 configured to generate a first calibration code PCODE<0:N> in response to a voltage of a first node ZQ and a reference voltage VREF and generate a second calibration code NCODE<0:N> in response to a voltage of a second node A and the reference voltage VREF; a first calibration resistor unit 420 of which internal resistors are turned on/off in response to the first calibration code PCODE<0:N>, the first calibration resistor unit 420 being connected to the first node ZQ; a first variable resistor unit 430 connected to the first calibration resistor unit 420 in parallel and having a resistance varied with a setting value; a second calibration resistor unit 450 of which internal resistors are turned on/off in response to the second calibration code NCODE<0:N>, the second calibration resistor unit 450 being connected to the second node A; and a second variable resistor unit 430 connected to the second calibration resistor unit 450 in parallel and having a resistance varied with a setting value. The calibration circuit of FIG. 4 further includes a dummy calibration resistor unit 440 having the same construction as the first calibration resistor unit 430.

The code generator 410 may include a first comparator 411 configured to compare the voltage of the first node ZQ with the reference voltage VREF; a first counter 412 configured to count the first calibration code PCODE<0:N> in response to a comparison result of the first comparator 411; a second comparator 413 configured to compare a voltage of the second node A with the reference voltage VREF; and a second counter 414 configured to count the second calibration code NCODE<0:N> in response to a comparison result of the second comparator 413.

The first calibration resistor unit 420, the dummy calibration resistor unit 440 and the second calibration resistor unit 450 respectively receive corresponding calibration codes PCODE<0:N> and NCODE<0:N> to change the voltage of the first node ZQ or the voltage of the second node A.

The first variable resistor unit 430 may be configured identically to the variable resistor unit 330 of FIG. 3. Specifically, the first variable resistor unit 430 may include at least one fuse circuit 431 configured to output a signal in response to whether a fuse is cut or not, and at least one resistor unit 432 configured to be turned on/off in response to the output signal of the fuse circuit 431. Basically, the setting value of the variable resistor unit 430 is determined by whether the fuse is cut or not. Alternatively, the setting value of the variable resistor unit 430 may be determined in response to a test mode signal TM_UP. Once the fuse has been cut out, it is impossible to restore the original state of the fuse. Therefore, it is preferable that a setting value is applied first as a trial through the application of the test mode signal TM_UP to thereby determine a suitable setting value and thereafter the fuse is cut. In this way, the first calibration code PCODE<0:N> can be changed by varying the resistance of the first variable resistor unit 430 using the fuse or the test mode signal TM_UP, thus making it possible to correct an error of the calibration operation.

The second variable resistor unit 460 may also have a similar construction to the first variable resistor unit 430. That is, the second variable resistor unit 460 includes at least one fuse circuit 461 configured to output a signal in response to whether a fuse is cut or not, and at least one resistor unit 462 configured to be turned on/off in response to an output signal of the fuse circuit 461. However, each of the resistor unit in the second variable resistor unit 460 is provides with a resistor and a NMOS transistor connected in series, the NMOS transistor receiving the output signal of the fuse circuit 461 through a gate thereof, whereas the resistor unit in the first variable resistor unit 430 includes a resistor and a PMOS transistor. Therefore, the second variable resistor unit 460 may be designed such that polarities of signals are inversed to those of signals used in the first variable resistor unit 430.

The resistance of the second variable resistor unit 460 can also be changed using the fuse or the test mode signal TM_DN. The second calibration code NCODE<0:N> can be changed by varying the resistance of the second variable resistor unit 460, so that is it possible to correct an error of the calibration operation.

Even though FIG. 4 illustrates that the first calibration code is the pull-up calibration code PCODE<0:N> and the second calibration code is the pull-down calibration code NCODE<0:N>, they may be interchanged. For instance, if the first calibration code is the pull-down calibration code NCODE<0:N> and the second calibration code is the pull-up calibration code PCODE<0:N>, the calibration circuit may be designed such that the external resistor is configured with a pull-up resistor, the first calibration resistor unit 420, the first variable resistor unit 430 and the dummy calibration resistor unit 440 are configured with pull-down resistors, and the second calibration resistor unit 450 and the second variable resistor unit 440 are configured with pull-up resistors. Resultingly, the pull-down calibration code NCODE<0:N> as the first calibration code is generated first while the second calibration resistor unit 450 and the second variable resistor unit 440 are calibrated with the external resistor 401, and thereafter the pull-up calibration code PCODE<0:N> as the second calibration code is generated on the basis of the pull-down calibration code NCODE<0:N>.

Figure 5:
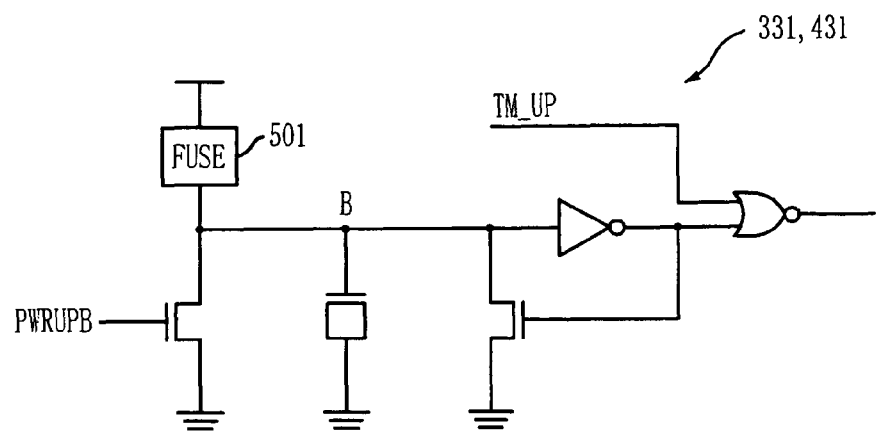
FIG. 5 is a schematic circuit diagram illustrating a fuse circuit used in a variable resistor unit of FIG. 3 and a first variable resistor of FIG. 4.

FIG. 5 is a schematic circuit diagram illustrating the fuse circuits 331 and 431 used in the variable resistor unit 330 of FIG. 3 and the first variable resistor unit 430 of FIG. 4.

Reference symbol PWRUPB denotes a power-up signal that maintains logic high level until a power supply voltage is stabilized but goes to logic low level after the power supply voltage is stabilized.

When the test mode signal TM_UP is deactivated, the fuse circuit outputs a signal of logic high level to turn off the resistor units 332 and 432 because a voltage of the node B maintains logic high level unless a fuse 501 is cut. However, if the fuse 501 is cut, the voltage of the node B does not maintain logic high level but goes to logic low level due to the power-up signal PWRUP, whereby the fuse circuit outputs a signal of logic low level to turn on the resistor units 332 and 432.

When the test mode signal TM_UP is activated, the fuse circuit always outputs a signal of logic low level irrespective of whether the fuse 501 is cut or not. In this way, the test mode signal TM_UP may be used for applying the setting value as a trial before the fuse is cut.

Figure 6:
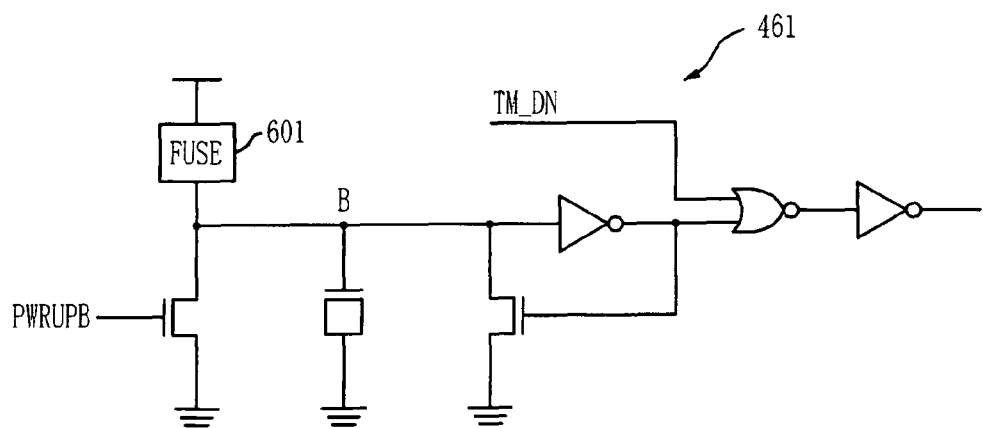
FIG. 6 is a schematic circuit diagram illustrating a fuse circuit used in a second variable resistor unit of FIG. 4.

FIG. 6 is a schematic circuit diagram illustrating a fuse circuit 461 used in the second variable resistor unit 460 of FIG. 4.

The fuse circuit 461 has the same design structure as the fuse circuit of FIG. 5 basically except that an inverter is added to an output terminal of the fuse circuit. Under the same condition, therefore, the fuse circuit 461 outputs a signal with an opposite polarity to the output signal in the fuse circuit of FIG. 5. The reason is that the output signal of the fuse circuit 461 of FIG. 6 is inputted to a gate of the NMOS transistor but the output signal of the fuse circuit of FIG. 5 is inputted to a gate of the PMOS transistor.

In accordance with the present invention, a calibration code can be easily changed through a change in a setting value of a variable resistor unit. Accordingly, the present invention provides such an advantageous merit that it is possible to easily correct an error between a target resistance and actual termination resistance in the semiconductor memory device, thus preventing data distortion caused by impedance mismatching.

While the present invention has been described with respect to the specific embodiments, it will be apparent to those skilled in the art that various changes and modifications may be made without departing from the spirit and scope of the invention as defined in the following claims.

What is claimed is:

1. A calibration circuit of a semiconductor memory device, comprising:
   a code generator configured to generate a calibration code for determining a termination resistance in response to a voltage of a first node and a reference voltage;
   a calibration resistor unit connected to the first node, including internal resistors turned on/off in response to the calibration code; and
   a variable resistor unit, connected to the first node and connected in parallel with the calibration resistor unit, configured to vary a resistance according to a setting value,
   wherein the variable resistor unit includes:
      a fuse circuit configured to output an output signal in response to a condition of a fuse; and
      a resistor unit configured to be turned on/off in response to the output signal of the fuse circuit.

2. The calibration circuit of claim 1, wherein the fuse circuit in the variable resistor unit includes one or more fuses and the setting value is determined by a condition of the fuses.

3. The calibration circuit of claim 1, wherein the fuse circuit in the variable resistor unit includes one or more fuses and the setting value is determined in response to at least one of a condition of the one or more fuses or a test mode signal.

4. The calibration circuit of claim 1, wherein the variable resistor unit includes a plurality of fuse-resistor sets and each of the fuse-resistor sets includes the respective fuse circuit and the respective resistor unit.

5. The calibration circuit of claim 1, wherein, when the fuse circuit receives a test mode signal, the output signal of the fuse circuit has a predetermined logic level irrespective of the condition of the fuse.

6. The calibration circuit of claim 1, wherein the first node is a ZQ node connected to an external calibration resistor.

7. The calibration circuit of claim 1, wherein the code generator includes a comparator configured to compare the voltage of the first node with the reference voltage, and a counter configured to generate the calibration code in response to a comparison result of the comparator.

8. A calibration circuit, comprising:
   a code generator configured to generate a first calibration code in response to a voltage of a first node and a reference voltage, and generate a second calibration code in response to a voltage of a second node and the reference voltage;
   a first calibration resistor unit connected to the first node and having a resistance that varies with the first calibration code;

a first variable resistor unit connected to the first node and connected in parallel with the first calibration resistor unit and having a resistance that varies according to a first setting value;

a second calibration resistor unit connected to the second node and having a resistance that varies with the second calibration code; and a second variable resistor unit connected to the second node and connected in parallel with the second calibration resistor unit and having a resistance that varies according to a second setting value, wherein each of the first and second variable resistor units includes:

a fuse circuit configured to output an output signal in response to a condition of a fuse: and a resistor unit configured to be turned on/off in response to the output signal.

9. The calibration circuit of claim 8, wherein the fuse circuit in each of the first and second variable resistor units includes at least one fuse, and the first and second setting values are determined by conditions of the at least one fuse of the first and second variable resistor units, respectively.

10. The calibration circuit of claim 8 wherein the variable resistor units each include a plurality of fuse resistor sets and each of the fuse resistor sets includes the respective fuse circuit and the respective resistor unit.

11. The calibration circuit of claim 8 wherein, when the fuse circuit in each of the first and second variable resistor units receives a corresponding test mode signal, the output signal has a predetermined logic level irrespective of the condition of the fuse.

12. The calibration circuit of claim 8, wherein the first calibration code is a pull-up calibration code for determining a pull-up termination resistance, and the second calibration code is a pull-down calibration code for determining a pull-down termination resistance.

13. The calibration circuit of claim 12, wherein the first node is a ZQ node connected to an external calibration resistor.

14. The calibration circuit of claim 8, further comprising a dummy calibration resistor unit, wherein the dummy calibration resistor unit is connected to the second node and has the same construction as the first calibration resistor unit.

15. The calibration circuit as recited in claim 8, wherein the code generator includes:

a first comparator configured to compare the voltage of the first node with the reference voltage;

a first counter configured to generate the first calibration code in response to a comparison result of the first comparator;

a second comparator configured to compare the voltage of the second node with the reference voltage; and a second counter configured to generate the second calibration code in response to a comparison result of the second comparator.

16. The calibration circuit as recited in claim 8, wherein the calibration circuit is applied to a semiconductor memory device, and the first and second calibration codes determine a termination resistance of an output driver of the semiconductor memory device.

* * * * *